United States Patent
Lin et al.

(10) Patent No.: US 8,736,014 B2
(45) Date of Patent: May 27, 2014

(54) HIGH MECHANICAL STRENGTH ADDITIVES FOR POROUS ULTRA LOW-K MATERIAL

(75) Inventors: Bo-Jiun Lin, Jhubei (TW); Ching-Yu Lo, Hsinchu (TW); Hai-Ching Chen, Hsinchu (TW); Tien-I Bao, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 28 days.

(21) Appl. No.: 12/271,617

(22) Filed: Nov. 14, 2008

(65) Prior Publication Data

US 2010/0123224 A1 May 20, 2010

(51) Int. Cl.
*H01L 21/31* (2006.01)

(52) U.S. Cl.
USPC ........... 257/499; 438/778; 438/780; 438/781; 257/E21.261; 257/E21.271; 257/E21.273

(58) Field of Classification Search
USPC .................. 438/778, 780, 781; 257/E21.261, 257/E21.273, 499, E21.271
See application file for complete search history.

(56) References Cited

U.S. PATENT DOCUMENTS

| | | | |
|---|---|---|---|
| 5,151,538 A | 9/1992 | Hayashi et al. | |
| 6,008,540 A | 12/1999 | Lu et al. | |
| 6,156,651 A | 12/2000 | Havemann | |
| 6,495,264 B2 | 12/2002 | Hayashi et al. | |
| 6,592,764 B1 | 7/2003 | Stucky et al. | |
| 7,128,976 B2 | 10/2006 | Hayashi et al. | |
| 7,888,233 B1* | 2/2011 | Gauri et al. | 438/436 |
| 2001/0051446 A1* | 12/2001 | Inoue et al. | 438/780 |
| 2002/0132496 A1* | 9/2002 | Ball et al. | 438/780 |
| 2003/0054115 A1* | 3/2003 | Albano et al. | 427/487 |
| 2004/0077757 A1* | 4/2004 | Araki et al. | 524/264 |
| 2004/0109950 A1* | 6/2004 | Adams et al. | 427/387 |
| 2005/0285290 A1* | 12/2005 | Nakanishi | 264/42 |
| 2007/0111529 A1* | 5/2007 | Nishino | 438/710 |
| 2007/0161226 A1* | 7/2007 | Dalton et al. | 438/622 |

OTHER PUBLICATIONS

Hyun Wook Ro et al., "High-Modulus Spin-On Organosilicate Glasses for Nanoporous Applications", Advanced Materials, Wiley InterScience, 2007 WILEY-VCH Verlag GmbH & Co., KGaA, Weihmeim, Adv. Mater. 2007, 19, 705-710.

Benjamin D. Hatton et al., "Spin-Coated Periodic Mesoporous Organosilica Thin Films—Towards a New Generation of Low-Dielectric-Constant Materials", Advanced Functional Materials, 2005, WILEY-VCH Verlag GmbH & Co., KGaA, Weinheim, Adv. Funct. Mater. 2005, 15, No. 5, May pp. 823-829.

* cited by examiner

*Primary Examiner* — Ermias Woldegeorgis
(74) *Attorney, Agent, or Firm* — Haynes and Boone, LLP

(57) ABSTRACT

A semiconductor device and method for making such that provides improved mechanical strength is disclosed. The semiconductor device comprises a semiconductor substrate; an adhesion layer disposed over the semiconductor substrate; and a porous low-k film disposed over the semiconductor substrate, wherein the porous low-k film comprises a porogen and a composite bonding structure including at least one Si—O—Si bonding group and at least one bridging organic functional group.

16 Claims, 5 Drawing Sheets

1 tetramethoxysilane (TMOS)

2 bis(triethoxysilyl)methane 3 bis(triethoxysilyl)ethene 4 1,2-bis(triethoxysilyl)ethane 5 1,4-bis(triethoxysilyl)benzene 6 1,3,5-tris(triethoxysilyl)benzene

HIGH MECHANICAL STRENGTH ADDITIVES FOR POROUS ULTRA LOW-K MATERIAL

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also requires ultra low-k materials to realize the scaled-down features. To achieve suitable ultra low-k materials, large quantities of porosity have been introduced into dielectric materials. However, the addition of porosity has resulted in deteriorating the mechanical properties of these materials (e.g., hardness, rigidity, etc.), leaving the materials unable to handle subsequent processing during semiconductor fabrication. For example, the weak mechanical strength of the porous low-k materials results in peeling after chemical mechanical planarization processes and delamination after packaging of the semiconductor devices.

Accordingly, what is needed is a semiconductor device that improves the mechanical strength of porous low-k materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
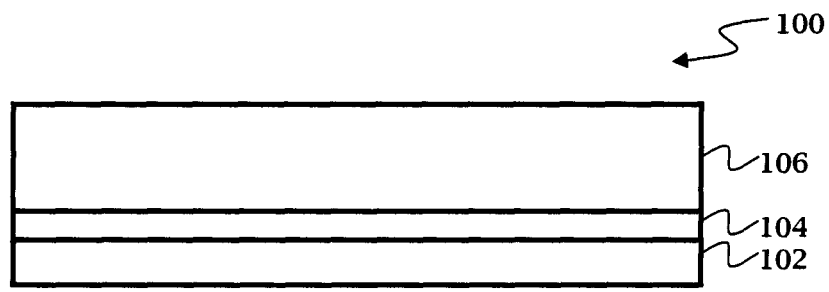
FIGS. 1A-1D are cross-sectional views of various embodiments of a semiconductor device made by the methods of FIGS. 3 and 4.

The present disclosure relates generally to the field of semiconductor devices, and more particularly, to a semiconductor device that includes a low-k material exhibiting improved mechanical strength.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present invention relate to semiconductor structures and methods for forming the semiconductor structures by using at least one additive having a bridging organic functional group, e.g., Si—C—C—Si, in a precursor solution for low-k dielectric. Adding a predetermined amount of the bridging organic functional group in the low-k dielectric desirably increases the strength of the low-k dielectric.

Figure 1B:
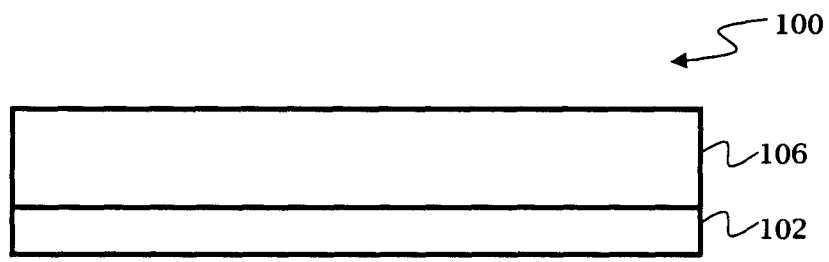
Figure 1C:
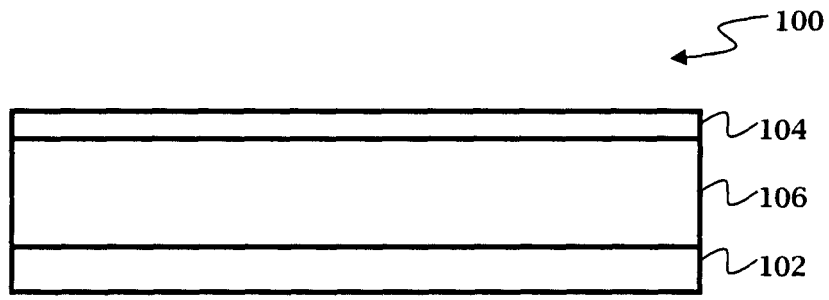
Figure 1D:
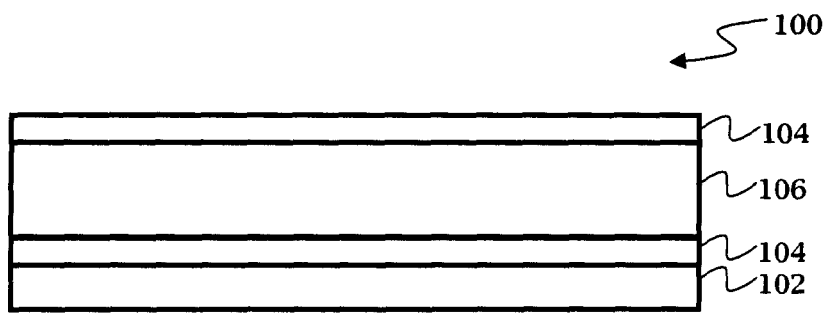
Figure 2:
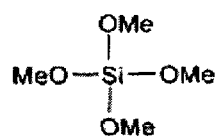
FIG. 2 provides additives including a bridging organic functional group according to aspects of the present invention.
Figure 2:
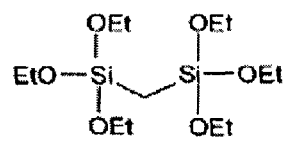
Figure 2:
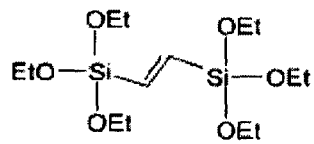
Figure 2:
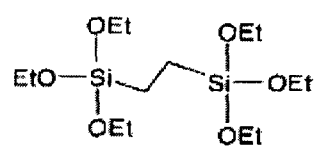
Figure 2:
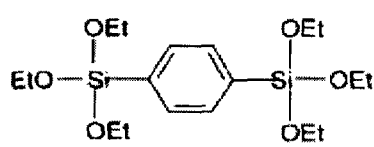
Figure 2:
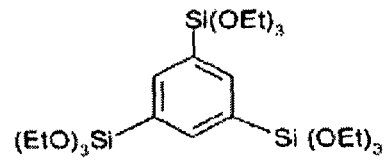
Figure 3:
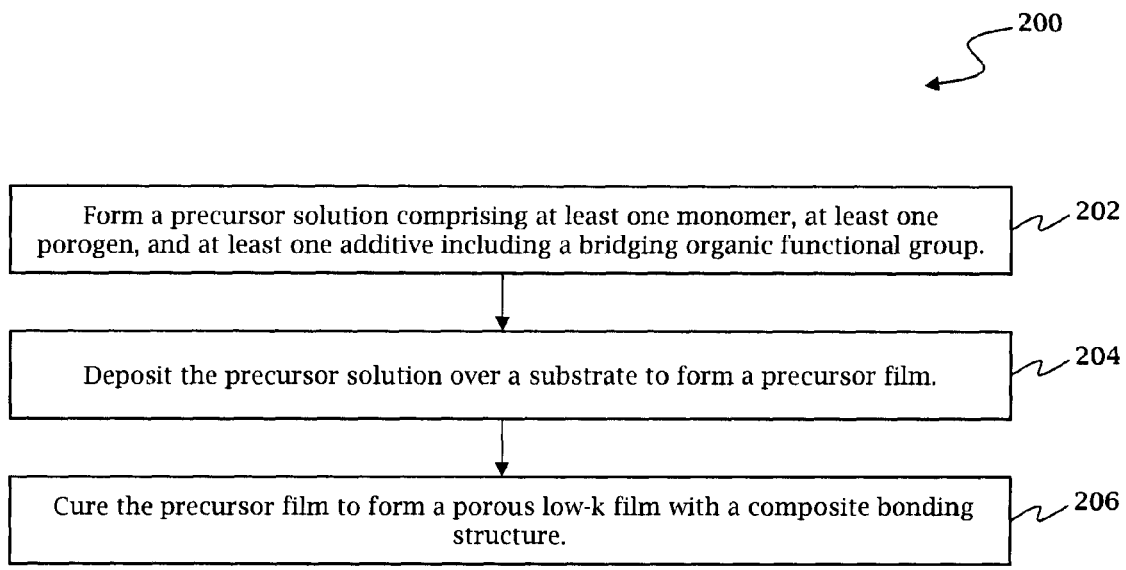
FIG. 3 is a flow chart of a method for forming a semiconductor device according to aspects of the present invention.
Figure 4:
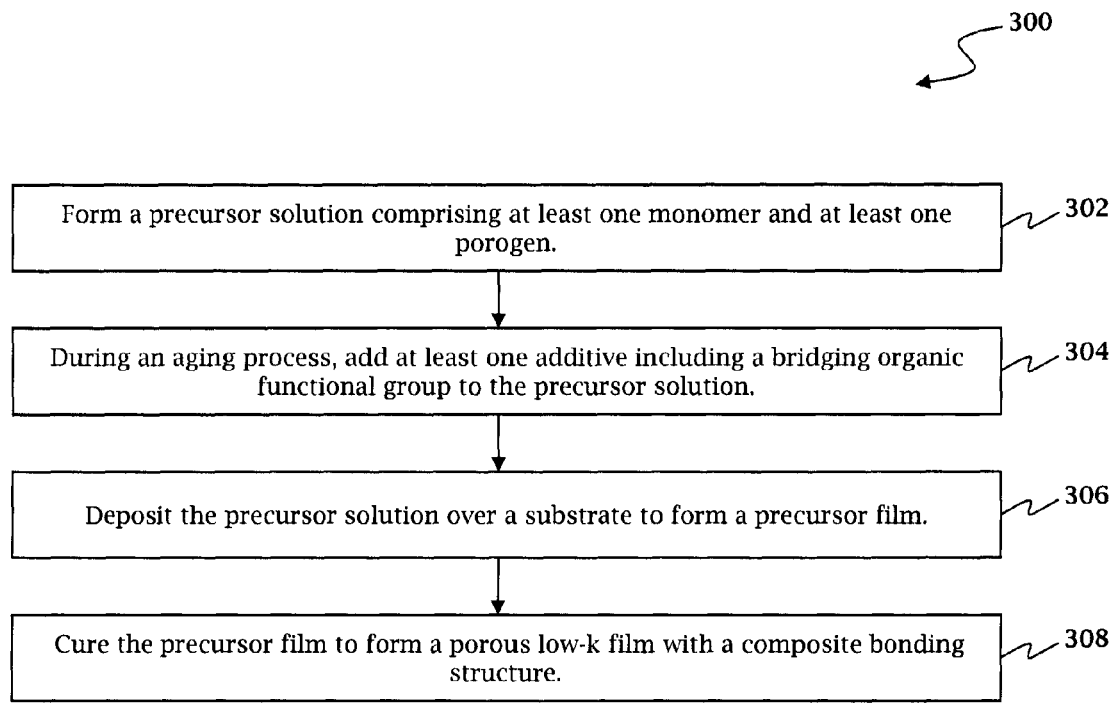
FIG. 4 is a flow chart of a method for forming a semiconductor device according to aspects of the present invention.
Figure 5:
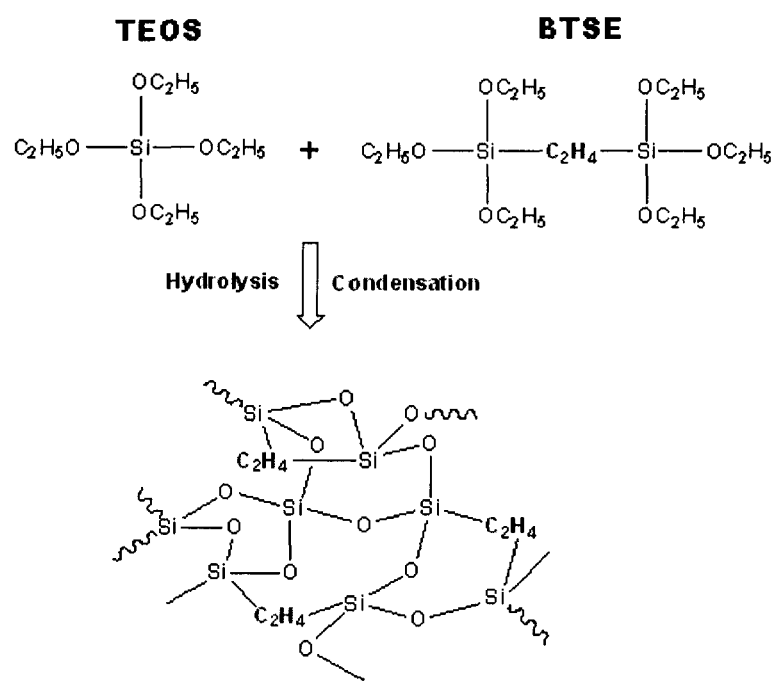
FIG. 5 illustrates a sol-gel reaction between at least one monomer and at least one additive including a bridging organic functional group according to aspects of the present invention.

With reference to FIGS. 1A through 5, a semiconductor device 100, a method 200, and a method 300 are collectively described below. FIGS. 1A-1D are cross-sectional views of the semiconductor device 100 according to various embodiments, in portion or entirety, fabricated by the methods 200, 300. FIG. 2 provides additives including a bridging organic functional group that the semiconductor device 100 may comprise. FIG. 3 is a flow chart of one embodiment of the method 200 for making the semiconductor device 100. FIG. 4 is a flow chart of one embodiment of the method 300 for making the semiconductor device 100. FIG. 5 illustrates a sol-gel reaction between at least one monomer and at least one additive including a bridging organic functional group that may occur during methods 200, 300. It is understood that additional steps can be provided before, during, and after the methods 200, 300, and some of the steps described below can be replaced or eliminated, for additional embodiments of the method. It is further understood that additional features can be added in the semiconductor device 100, and some of the features described below can be replaced or eliminated, for additional embodiments of the semiconductor device 100. The present embodiment of semiconductor device 100 and methods 200, 300 provides a semiconductor device with improved mechanical strength.

Referring to FIG. 1A, the semiconductor device 100 includes a semiconductor substrate 102, an adhesion layer 104, and a porous low-k film 106 including at least one monomer, at least one porogen, and at least one additive including a bridging organic functional group. In alternate embodiments, the semiconductor device 100 may comprise more than one semiconductor substrate 102, adhesion layer 104, and/or porous low-k film 106.

The semiconductor substrate 102 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In the present embodiment, the adhesion layer 104 is deposited over the semiconductor substrate 102. The adhesion layer 104 may act to modify surfaces to enhance adhesion between the substrate and subsequently deposited layers. The adhesion layer 104 may be deposited by any suitable method over the semiconductor substrate 102, such as chemical vapor deposition (CVD), plasma enhanced CVD (PECVD), physical vapor deposition (PVD), atomic layer deposition (ALD), sputtering, plating, spin-on deposition, dipping, other suitable methods, and/or combinations thereof. In the present embodiment, the adhesion layer 104 is deposited by a spin-on method.

The adhesion layer 104 may comprise any suitable material. In some embodiments, the adhesion layer 104 comprises an amphiphilic block copolymer, a polymer, a cationic surfactant, an anionic surfactant, a non-ionic surfactant, a silane, other suitable materials, and/or combinations thereof. In some embodiments, the adhesion layer 104 may comprise polycrystalline silicon; silicon-containing materials; germanium-containing materials; metal, such as aluminum, copper, tungsten, titanium, tantalum, titanium nitride, tantalum nitride, nickel silicide, cobalt silicide; other suitable materials; and/or combinations thereof.

The porous low-k film 106 is deposited over the semiconductor substrate 102. In the present embodiment, as illustrated in FIG. 1A, the porous low-k film 106 is also deposited over the adhesion layer 104. It is understood that the adhesion layer 104 and the porous low-k film 106 may be deposited over the substrate 102 in any order. For example, in some embodiments, the adhesion layer 104 may be omitted partially or entirely from the semiconductor device 100 as illustrated in FIG. 1B; the adhesion layer 104 may be deposited over the porous low-k film 106 as illustrated in FIG. 1C; and/or the adhesion layer 104 may be deposited over and under the porous low-k film 106 as illustrated in FIG. 1D. It is further understood that the adhesion layer 104 and the porous low-k film 106 may comprise multiple layers and that additional layers may be disposed between the semiconductor substrate 102, the adhesion layer 104, and the porous low-k film 106.

The porous low-k film 106 comprises at least one monomer, at least one porogen, and at least one additive including a bridging organic functional group. The combination of the at least one monomer, porogen, and additive including the bridging organic functional group improves the mechanical strength of the porous low-k film 106. Specifically, the additive including the bridging organic functional group increases the strength and rigidity of the porous low-k film 106 while maintaining the film's desirable low-k characteristics as discussed further below.

The at least one monomer provides the main matrix for the composition of the porous low-k film 106. The at least one monomer may comprise tetraethyl orthosilicate (TEOS), tetramethoxysilane (TMOS), methyltrimethoxysilane (MTMS), methyltriethoxysilane (MTES), other suitable monomers, and/or combinations thereof. The TEOS and TMOS monomers may be hydrophilic, and the MTMS and MTES monomers may be hydrophobic. In some embodiments, varying ratios of the hydrophilic and hydrophobic monomers may be utilized to tune the properties of the porous low-k film 106. In some embodiments, the main matrix for the composition of the porous low-k film 106 comprises at least two monomers. For example, the porous low-k film 106 may comprise a TEOS and a MTES monomer; a TEOS and a MTMS monomer; a TMOS and a MTES monomer; a TMOS and a MTMS monomer; or any other suitable combination. The at least one monomer provides the porous low-k film 106 with Si—O—Si bridging groups.

The at least one porogen may comprise an amphiphilic block copolymer, a polymer, a cationic surfactant, an anionic surfactant, a non-ionic surfactant, a non-surfactant type, other suitable porogens, and/or combinations thereof. A porogen including an amphiphilic block copolymer may comprise a triblock copolymer, a diblock copolymer, and/or combinations thereof. A porogen including a surfactant type may comprise an ionic, non-ionic, or polymer surfactant. In one example, a cationic surfactant includes $CH_3(CH_2)_nN^+(CH_3)_3BR$. In one example, an anionic surfactant includes $CH_3(CH_2)_nSO_3^-Na^+$. A porogen including a non-surfactant type may comprise ATRP (atom transfer radical polymerization) or polystyrene. In one example, a non-ionic surfactant includes $CH_3(CH_2)_n(CH_2CH_2O)_n$—OH. A porogen including a block copolymer may comprise HO—$(CH_2CH_2O)_n$—$(CH_2CHO)_m$—$(CH_2CH_2O)_n$H.

Conventionally, though porous low-k films exhibit the ultra-low dielectric constants desirable in scaled-down semiconductor devices, such conventional films exhibit weaker than desirable mechanical strength, and further provide poor adhesion strength at interfaces (e.g., an etch stop layer/low-k film interface). The weak mechanical strength results in problems during subsequent semiconductor processing, such as peeling of the films after chemical mechanical planarization processes and delamination after packaging processes. In the present embodiment, the porous low-k film 106 further comprises the at least one additive including a bridging functional group, which provides increased mechanical strength to the film while maintaining the film's desirable low-k characteristics. The at least one additive including a bridging organic functional group comprises bis(triethoxysilyl)methane (BTSM), bis(triethoxysilyl)ethane (BTSE), bis(triethoxysilyl)benzene (BTSB), other compounds with a bridging organic functional group, and/or combinations thereof. FIG. 2 provides some examples of additives including a bridging organic functional group. In the present embodiment, the at least one additive comprises BTSE.

The at least one additive including the bridging organic functional group provides the porous low-k film 106 with Si—C—C—Si bridging groups. The bridging organic functional group Si—C—C—Si substantially improves the mechanical strength of the porous low-k film 106 because a molecular structure with a Si—C—C—Si bridging group provides higher rigidity than the molecular structure of the Si—O—Si bridging group alone. By introducing the additive including a bridging organic functional group (i.e., the Si—C—C—Si bridging groups) into the main matrix (i.e., comprising the Si—O—Si bridging groups) of conventional porous low-k films, the resulting porous low-k films that comprise a composite bonding structure including Si—O—Si and Si—C—C—Si bridging groups exhibit increased hardness, strength, and rigidity. The addition of the Si—C—C—Si bridging group to the at least one monomer and porogen to form the porous low-k film increases the hardness of the porous low-k films as much as 30%. Further, the addition of the Si—C—C—Si bridging group maintains desirable low dielectric constants, increasing the dielectric constant less than 5% when compared to conventional porous low-k films.

The amount of Si—C—C—Si bridging groups contained monomer to the overall matrix amount (including Si—O—Si and Si—C—C—Si) could be less than 30% in molar ration.

The porous low-k film 106 may be fabricated by the method 200 illustrated in FIG. 3. Referring to FIG. 3, the method 200 begins at step 202 where a precursor solution is formed by preparing a mixture comprising at least one monomer, at least one porogen, and at least one additive including a bridging organic functional group. The combination of the at least one monomer, porogen, and additive including the bridging organic functional group improves the mechanical strength of the subsequently formed porous low-k film 106. Specifically, the additive including the bridging organic functional group increases the strength and rigidity of the porous low-k film 106 while maintaining the film's desirable low-k characteristics.

The at least one monomer provides the main matrix for the composition of the porous low-k film 106. The at least one monomer may comprise TEOS, TMOS, MTMS, MTES, other suitable monomers, and/or combinations thereof. The TEOS and TMOS monomers may be hydrophilic, and the MTMS and MTES monomers may be hydrophobic. In some embodiments, varying ratios of the hydrophilic and hydrophobic monomers may be utilized to tune the properties of the porous low-k film 106. In some embodiments, the main matrix for the composition of the porous low-k film 106 comprises at least two monomers. For example, the porous low-k film 106 may comprise a TEOS and a MTES monomer; a TEOS and a MTMS monomer; a TMOS and a MTES monomer; or a TMOS and a MTMS monomer.

The at least one porogen may comprise an amphiphilic block copolymer, a polymer, a cationic surfactant, an anionic surfactant, a non-ionic surfactant, a non-surfactant type, other suitable porogens, and/or combinations thereof. A porogen including an amphiphilic block copolymer may comprise a triblock copolymer, a diblock copolymer, and/or combinations thereof. A porogen including a surfactant type may comprise an ionic, non-ionic, or polymer surfactant. In one example, a cationic surfactant includes $CH_3(CH_2)_nN^+(CH_3)_3BR$. In one example, an anionic surfactant includes $CH_3(CH_2)_nSO_3^-Na^+$. A porogen including a non-surfactant type may comprise ATRP (atom transfer radical polymerization) or polystyrene. In one example, a non-ionic surfactant includes $CH_3(CH_2)_n(CH_2CH_2O)_n$—OH. A porogen including a block copolymer may comprise HO—$(CH_2CH_2O)_n$—$(CH_2CHO)_m$—$(CH_2CH_2O)_n$H.

The at least one additive including a bridging organic functional group comprises BTSM, BTSE, BTSB, other compounds with a bridging organic functional group, and/or combinations thereof. In the present embodiment, the at least one additive comprises BTSE. As noted above, the at least one additive including the bridging organic functional group provides the porous low-k film 106 with Si—C—C—Si bridging groups. The bridging organic functional group Si—C—C—Si substantially improves the mechanical strength of the porous low-k film 106 because a molecular structure with a Si—C—C—Si bridging group provides higher rigidity than the molecular structure of the Si—O—Si bridging group alone. By introducing the additive including a bridging organic functional group (i.e., the Si—C—C—Si bridging groups) into the main matrix (i.e., comprising the Si—O—Si bridging groups) of conventional porous low-k films, the resulting porous low-k films, which comprise a composite bonding structure that includes Si—O—Si and Si—C—C—Si bridging groups, exhibit increased hardness, strength, rigidity, and adhesion. The amount of Si—C—C—Si bridging groups contained monomer to the overall matrix amount (including Si—O—Si and Si—C—C—Si) could be less than 30% in molar ration.

The mixture may further comprise water, solvents, catalysts, other suitable additives, and/or combinations thereof. In the present embodiment, the mixture further comprises water ($H_2O$), a solvent, and a catalyst. The solvent may comprise ethanol ($C_2H_5OH$). The catalyst may comprise an acid catalyst, such as hydrochloric acid (HCl).

The mixture (e.g., at least one monomer, at least one porogen, at least one additive including the bridging organic functional group, water, a solvent, and a catalyst) reacts in a sol-gel reaction (i.e., a series of hydrolysis and polycondensation reactions) to form the precursor solution. Forming the precursor solution may include an aging process, for example, the mixture may be left in predetermined conditions to react for any suitable length of time. In some embodiments, the aging process includes placing the mixture in room temperature for approximately two hours while the mixture reacts in the sol-gel reaction. FIG. 5 illustrates a sol-gel reaction between at least one monomer and at least one additive including the bridging organic functional group, specifically when the at least one monomer comprises a TEOS monomer and that at least one additive comprises a BTSE. As evident from FIG. 5, the sol-gel reaction results in a composite bonding structure including Si—O—Si and Si—C—C—Si bridging groups.

Referring to FIG. 3, at step 204, the precursor solution is deposited over the substrate 102 to form a precursor film. In the present embodiment, the precursor solution may also be deposited over the adhesion layer 104 as illustrated in FIG. 1A. The precursor solution may be deposited by any suitable process. For example, the deposition processes may include CVD, PECVD, high density PECVD, photon assisted CVD, plasma-photon assisted CVD, PVD, ALD, sputtering, plating, spin-on deposition, dip coating, roll coating, spraying, other suitable methods, and/or combinations thereof. In the present embodiment, the precursor solution is deposited by a spin-on deposition process. For example, the precursor solution may be deposited by a spin-on method between approximately 700 revolutions per minute (rpm) and 1500 rpm.

After being deposited over the substrate 102, the precursor film is cured and/or calcinated to form the porous low-k film 106 with a composite bonding structure at step 206. The precursor film may be cured by any suitable method. The curing method may include UV curing, thermal curing, other suitable curing methods, or combinations thereof. In some embodiments, the UV curing may comprise single wavelength, broadband wavelength, and/or other suitable wavelengths. In one example, the precursor film is UV cured under near vacuum over 350° C. In another example, the precursor film is thermal-UV cured under atmosphere over 350° C. The resulting porous low-k film 106 has a dielectric constant less than 2.5, exhibits increased mechanical strength, and includes a composite bonding structure including Si—O—Si and Si—C—C—Si bridging groups. The resulting porous low-k film further exhibits enhanced adhesion strength at interfaces.

The porous low-k film 106 may also be fabricated by the method 300 illustrated in FIG. 4. Referring to FIG. 4, the method 300 begins at step 302 where a precursor solution is formed by preparing a mixture comprising at least one monomer and at least one porogen. The mixture may further comprise water, solvents (e.g., ethanol ($C_2H_5OH$)), catalysts (e.g., hydrochloric acid (HCl)), other suitable additives, and/or combinations thereof. The mixture (e.g., at least one monomer, at least one porogen, water, a solvent, and a catalyst)

reacts in a sol-gel reaction (i.e., a series of hydrolysis and polycondensation reactions) to form the precursor solution.

The at least one monomer provides the main matrix for the composition of the porous low-k film 106. The at least one monomer may comprise TEOS, TMOS, MTMS, MTES, other suitable monomers, and/or combinations thereof. The TEOS and TMOS monomers may be hydrophilic, and the MTMS and MTES monomers may be hydrophobic. In some embodiments, varying ratios of the hydrophilic and hydrophobic monomers may be utilized to tune the properties of the porous low-k film 106. In some embodiments, the main matrix for the composition of the porous low-k film 106 comprises at least two monomers. For example, the porous low-k film 106 may comprise a TEOS and a MTES monomer; a TEOS and a MTMS monomer; a TMOS and a MTES monomer; or a TMOS and a MTMS monomer.

The at least one porogen may comprise an amphiphilic block copolymer, a polymer, a cationic surfactant, an anionic surfactant, a non-ionic surfactant, a non-surfactant type, other suitable porogens, and/or combinations thereof. A porogen including an amphiphilic block copolymer may comprise a triblock copolymer, a diblock copolymer, and/or combinations thereof. A porogen including a surfactant type may comprise an ionic, non-ionic, or polymer surfactant. In one example, a cationic surfactant includes $CH_3(CH_2)_nN^+(CH_3)_3BR$. In one example, an anionic surfactant includes $CH_3(CH_2)_nSO_3^-Na^+$. A porogen including a non-surfactant type may comprise ATRP (atom transfer radical polymerization) or polystyrene. In one example, a non-ionic surfactant includes $CH_3(CH_2)_n(CH_2CH_2O)_n$—OH. A porogen including a block copolymer may comprise $HO$—$(CH_2CH_2O)_n$—$(CH_2CHO)_m$—$(CH_2CH_2O)_nH$.

In the present embodiment, forming the precursor solution includes an aging process, wherein the mixture is left in predetermined conditions to react for a suitable length of time. At step 304, during the aging process of the precursor solution, at least one additive including a bridging organic functional group is added to the precursor solution. The at least one additive including a bridging organic functional group comprises BTSM, BTSE, BTSB, other compounds with a bridging organic functional group, and/or combinations thereof. In the present embodiment, the at least one additive comprises BTSE. As noted above, the at least one additive including the bridging organic functional group provides the porous low-k film 106 with Si—C—C—Si bridging groups. The bridging organic functional group Si—C—C—Si substantially improves the mechanical strength of the porous low-k film 106 because a molecular structure with a Si—C—C—Si bridging group provides higher rigidity than the molecular structure of the Si—O—Si bridging group alone. By introducing the additive including a bridging organic functional group (i.e., the Si—C—C—Si bridging groups) into the main matrix (i.e., comprising the Si—O—Si bridging groups) of conventional porous low-k films, the resulting porous low-k films, which comprise a composite bonding structure that includes Si—O—Si and Si—C—C—Si bridging groups, exhibit increased hardness, strength, rigidity, and adhesion.

Referring to FIG. 4, at step 306, the precursor solution is deposited over the substrate 102 to form a precursor film. In the present embodiment, the precursor solution may be deposited over the adhesion layer 104. The precursor solution may be deposited by any suitable process. For example, the deposition processes may include CVD, PECVD, high density PECVD, photon assisted CVD, plasma-photon assisted CVD, PVD, ALD, sputtering, plating, spin-on deposition, dip coating, roll coating, spraying, other suitable methods, and/or combinations thereof. In the present embodiment, the precursor solution is deposited by a spin-on deposition process. For example, the precursor solution may be deposited by a spin-on method between approximately 700 rpm and 1500 rpm.

After being deposited over the substrate 102, the precursor film is cured to form the porous low-k film 106 with a composite bonding structure at step 308. The precursor film may be cured by any suitable method. The curing method may include UV curing, thermal curing, other suitable curing methods, or combinations thereof. In some embodiments, the UV curing may comprise single wavelength, broadband wavelength, and/or other suitable wavelengths. In one example, the precursor film is UV cured under near vacuum over 350° C. In another example, the precursor film is thermal-UV cured under atmosphere over 350° C. The resulting porous low-k film 106 has a dielectric constant less than 2.5, exhibits increased mechanical strength, and includes a composite bonding structure including Si—O—Si and Si—C—C—Si bridging groups. The resulting porous low-k film further exhibits enhanced adhesion strength at interfaces.

The examples described above may include the following embodiments: (1) the mixture includes a combination of monomers (e.g., TEOS and MTMS), a porogen comprising a surfactant type compound, such as an ionic, non-ionic, and/or polymer compound, and an additive comprising BTSE; and the adhesion layer comprises a silane type compound; (2) the mixture includes a combination of monomers (e.g., TEOS and MTMS), a porogen comprising a non-surfactant type compound, such as ATRP and/or a polystyrene, and an additive comprising BTSE; and the adhesion layer comprises a silane type compound; (3) the mixture includes a combination of monomers (e.g., TEOS and MTMS), a porogen comprising a surfactant type compound, such as an ionic, non-ionic, and/or polymer compound, and an additive comprising BTSE; and the adhesion layer comprises a surfactant type compound; and (4) the mixture includes a combination of monomers (e.g., TEOS and MTMS), a porogen comprising a non-surfactant type compound, such as ATRP and/or a polystyrene, and an additive comprising BTSE; and the adhesion layer comprises a surfactant type compound. Further, it is understood that, as discussed above and illustrated in FIGS. 1B, 1C, and 1D, the adhesion layer 104 may be deposited over or under the porous low-k film 106 in methods 200, 300.

In summary, a semiconductor device is provided with improved mechanical strength. Overall, the disclosed embodiments provide one or more of the following advantages: increased mechanical strength; increased hardness; increased rigidity; increased adhesion; and maintained low-k characteristics. In one embodiment, a semiconductor device providing increased strength and rigidity comprises a semiconductor substrate; an adhesion layer disposed over the semiconductor substrate; and a porous low-k film disposed over the semiconductor substrate, wherein the porous low-k film comprises a porogen and a composite bonding structure including at least one Si—O—Si bonding group and a bridging organic functional group.

In some embodiments, the adhesion layer may comprise an amphiphilic block copolymer, a polymer, a cationic surfactant, an anionic surfactant, a non-ionic surfactant, a silane, or combinations thereof. The porous low-k film comprises a dielectric constant less than or equal to 2.5. In some embodiments, the porogen comprises an amphiphilic block copolymer, a polymer, a cationic surfactant, an anionic surfactant, a non-ionic surfactant, a non-surfactant type, or combinations thereof. The bridging organic functional group comprises at least one Si—C—C—Si bonding group. In some embodiments, the bridging organic functional group comprises methane, ethene, benzene, other suitable organic functional groups, or combinations thereof.

In one embodiment, a method for forming a dielectric layer with increased strength and adhesion comprises preparing a precursor solution, wherein the precursor solution comprises a main matrix including at least one monomer, at least one porogen, and at least one additive including a bridging organic functional group; depositing the precursor solution over a substrate, wherein the deposited precursor solution forms a precursor film; and curing the precursor film to form a porous low-k film with a composite bonding structure. The method may further comprise forming an adhesion promoter layer over the substrate.

Preparing the precursor solution may comprise a sol-gel reaction, and depositing the precursor solution may comprise spin-on coating. The porous low-k film comprises a dielectric constant less than or equal to 2.5. The composite bonding structure comprises a Si—O—Si bonding group and a Si—C—C—Si bonding group. Curing the precursor film may comprise at least one of either UV curing or thermal curing. In some embodiments, the UV curing comprises at least one of either single wavelength or broadband wavelength.

In some embodiments, the additive comprises bis(triethoxysilyl)methane, bis(triethoxysilyl)ethane, bis(triethoxysilyl)benzene, other compound with a bridging organic group, or combinations thereof. In some embodiments, the at least one monomer comprises tetraethyl orthosilicate (TEOS), tetramethoxysilane (TMOS), methyltrimethoxysilane (MTMS), methyltriethoxysilane (MTES), other suitable monomers, or combinations thereof. In some embodiments, the porogen comprises a amphiphilic block copolymer, a polymer, a cationic surfactant, an anionic surfactant, a non-ionic surfactant, a non-surfactant type, or combinations thereof.

In another embodiment, a method for forming a dielectric material comprises preparing a precursor solution comprising at least one monomer and at least one porogen; adding at least one additive including a bridging organic functional group to the precursor solution during an aging process; depositing the precursor solution over a substrate to form a precursor film; and curing the precursor film to form a porous low-k film with a composite bonding structure. The method may further comprise forming an adhesion promoter layer over the substrate.

Preparing the precursor solution may comprise a sol-gel reaction. Depositing the precursor solution may comprise spin-on coating. The porous low-k film comprises a dielectric constant less than or equal to 2.5. The composite bonding structure comprises a Si—O—Si bonding group and a Si—C—C—Si bonding group. Curing the precursor film comprises at least one of either UV curing or thermal curing. In some embodiments, the UV curing comprises at least one of either single wavelength or broadband wavelength.

In some embodiments, the additive comprises bis(triethoxysilyl)methane, bis(triethoxysilyl)ethane, bis(triethoxysilyl)benzene, other compound with a bridging organic group, or combinations thereof. In some embodiments, the at least one monomer comprises tetraethyl orthosilicate (TEOS), tetramethoxysilane (TMOS), methyltrimethoxysilane (MTMS), methyltriethoxysilane (MTES), other suitable monomers, or combinations thereof. In some embodiments, the porogen comprises a amphiphilic block copolymer, a polymer, a cationic surfactant, an anionic surfactant, a non-ionic surfactant, a non-surfactant type, or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
preparing a precursor solution, wherein the precursor solution comprises a main matrix including at least one monomer and at least one porogen;
adding, during an aging process and after the precursor solution has been prepared, at least one additive including a bridging organic functional group to the precursor solution;
forming an adhesion promoter layer over a substrate;
after forming the adhesion promoter layer, depositing the precursor solution over the adhesion promoter layer, wherein the deposited precursor solution forms a precursor film; and
curing the precursor film to form a porous low-k film with a composite bonding structure,
wherein the at least one monomer is formed of a tetramethoxysilane (TMOS) monomer and at least one of a methyltrimethoxysilane (MTMS) and methyltriethoxysilane (MTES) monomer, and the at least one additive is selected from the group consisting of bis(triethoxysilyl)methane (BTSM), bis(triethoxysilyl)ethane (BTSE), and bis(triethoxysilyl)benzene (BTSB).

2. The method of claim 1 wherein preparing the precursor solution comprises a sol-gel reaction.

3. The method of claim 1 wherein depositing the precursor solution comprises spin-on coating.

4. The method of claim 1 wherein the porous low-k film comprises a dielectric constant less than or equal to 2.5.

5. The method of claim 1 wherein the porogen comprises a amphiphilic block copolymer, a polymer, a cationic surfactant, an anionic surfactant, a non-ionic surfactant, a non-surfactant type, or combinations thereof.

6. The method of claim 1 wherein curing the precursor film comprises at least one of either UV curing or thermal curing.

7. The method of claim 6 wherein the UV curing comprises at least one of either single wavelength or broadband wavelength.

8. The method of claim 1 wherein the composite bonding structure comprises at least one Si—O—Si bonding group and at least one Si—C—C—Si bonding group.

9. The method of claim 8 wherein the composite bonding structure comprises a Si—O—Si bonding group and a Si—C—C—Si bonding group.

10. A method for forming a dielectric material comprising:
preparing a precursor solution comprising at least one monomer and at least one porogen;
adding, after the precursor solution has been prepared, an additive including a bridging organic functional group to the precursor solution during an aging process;
depositing the precursor solution over a substrate to form a precursor film; and
curing the precursor film to form a porous low-k film with a composite bonding structure,
wherein the at least one monomer is formed of a tetramethoxysilane (TMOS) monomer and at least one of a methyltrimethoxysilane (MTMS) and methyltriethoxysilane (MTES) monomer, and the additive includes bis(triethoxysilyl)benzene (BTSB).

11. The method of claim 10 further comprising forming an adhesion promoter layer over the substrate.

12. The method of claim 10 wherein preparing the precursor solution comprises a sol-gel reaction.

13. The method of claim 10 wherein depositing the precursor solution comprises spin-on coating.

14. The method of claim 10 wherein the porous low-k film comprises a dielectric constant less than or equal to 2.5.

15. The method of claim 10 wherein the porogen comprises a amphiphilic block copolymer, a polymer, a cationic surfactant, an anionic surfactant, a non-ionic surfactant, a non-surfactant type, or combinations thereof.

16. The method of claim 10 wherein curing the precursor film comprises at least one of either UV curing, the UV curing comprising at least one of either single wavelength or broadband wavelength, or thermal curing.

* * * * *